United States Patent [19]

Booth

[11] 3,871,068

[45] Mar. 18, 1975

[54] PROCESS FOR PACKAGING A SEMICONDUCTOR CHIP

[75] Inventor: Charles Lawrence Booth, Wilmington, Del.

[73] Assignee: E. I. du Pont de Nemours and Company, Wilmington, Del.

[22] Filed: Feb. 4, 1974

[21] Appl. No.: 439,642

Related U.S. Application Data

[62] Division of Ser. No. 354,129, April 24, 1973, Pat. No. 3,820,152.

[52] U.S. Cl........................... 29/590, 29/627, 29/588

[51] Int. Cl.............................................. B01j 17/00

[58] Field of Search.......... 29/576 S, 588, 589, 590, 29/591, 627

[56] References Cited

UNITED STATES PATENTS

| | | | |
|---|---|---|---|
| 3,431,637 | 3/1969 | Caracciolo | 29/591 |
| 3,495,023 | 2/1970 | Hessinger | 29/627 |
| 3,665,592 | 5/1972 | Apospors | 29/588 |
| 3,723,834 | 3/1973 | Peters | 357/74 |

*Primary Examiner*—Roy Lake
*Assistant Examiner*—W. C. Tupman

[57] ABSTRACT

A semiconductor package is provided with a metallized fugitive shorting bar across the conductor pads or leads to prevent electrical damage to a semiconductor chip, inserted therein, from static electricity discharges. The process also comprises removing the shorting bar by solder leaching. The shorting bar is screen printed as a thick-film metallized strip or bar across the conductor package. After a semiconductor chip is inserted in the package by the semiconductor manufacturer and the chip attached and sealed, the shorting bar may be removed at the same time the leads are soldered to the package by the solder leaching properties of a tin-lead-silver or tin-lead solder.

Silver is the preferred material of the shorting bar since it is readily compatible with tin-lead-silver or tin-lead solder. However, gold, tin, lead or any thick film material readily dissolved or leached by the solder may be used.

3 Claims, 2 Drawing Figures

PROCESS FOR PACKAGING A SEMICONDUCTOR CHIP

CROSS-REFERENCE TO RELATED APPLICATION

This is a division of my copending patent application U.S. Ser. No. 354,129, filed Apr. 24, 1973 now U.S. Pat. No. 3,820,152.

BACKGROUND OF THE INVENTION

1. Field of the Invention

This invention relates to electronic circuits, and particularly relates to packages for semiconductor electronic circuits. More particularly, it relates to semiconductor electronic packages wherein electrically shorted leads are required to prevent electrical damage to the semiconductor circuit from static electric discharges.

2. Description of the Prior Art

Semiconductor electronic circuit packages having lead frames terminating in or connecting to a common bar are well known in the art. U.S. Pat. No. 3,617,819; U.S. Pat. No. 3,665,592; and U.S. Pat. No. 3,676,569 all describe packages for semiconductor electronic circuits, having a plurality of conductive leads integrally formed with a frame portion or common bar which electrically short leads during insertion of the semiconductor circuit and connection of the leads thereto by the circuit manufacturer. Although this type of lead frame and shorting bar provide sufficient protection for the semiconductor chip during insertion and connection of the individual conductor leads, it must be separately removed, e.g., by cutting from the conductor leads, before the circuit is ready for use.

The fugitive thick-film shorting bar of the present invention provides a substantial advance over the integral conductor lead frame and shorting bar of the prior art, as it may be readily removed by leaching the bar from the package during soldering of the conductor leads to said package, e.g., by dip or wave soldering techniques.

SUMMARY OF THE INVENTION

According to this invention, there is provided in a semiconductor electronic circuit package, comprising a substrate having conductor patterns thereon, and conductor pads or leads connected to said conductor pattern, the improvement comprising fugitive shorting means for electrically shorting said conductor pads or leads during insertion of a semiconductor chip, said shorting means being removable by solder leaching. Also provided is a process for packaging a semiconductor chip, said package comprising a substrate having conductor patterns thereon and conductor pads or leads connected to said conductor pattern, the improvement comprising the steps of applying a fugitive shorting bar to electrically interconnect said conductor pads or leads, inserting said semiconductor chip in said package, and removing said shorting bar by solder leaching.

The means for shorting is preferably a silver thick-film metallization with or without glass frit, although any material may be used which is readily dissolved or leached by solder, e.g., gold, tin, and lead.

DETAILED DESCRIPTION OF THE INVENTION

Figure 1:
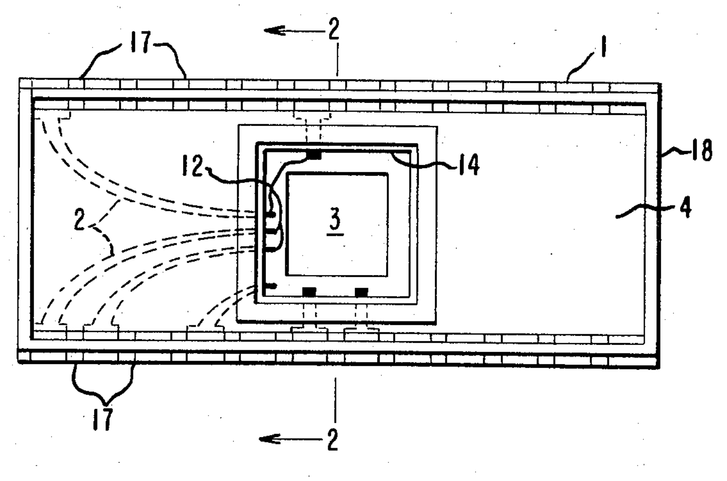
FIG. 1 is a planned view of a dual inline package for a semiconductor chip.
Figure 2:
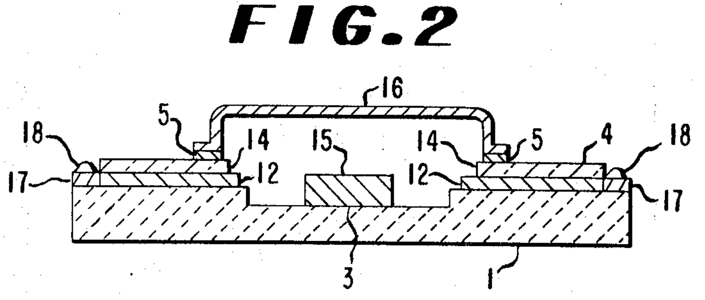
FIG. 2 is a cross-sectional elevation of the package of FIG. 1 taken along line 2—2 in FIG. 1.

The invention is described with reference to the package of the invention shown in the attached drawings, wherein the same numbers are used throughout to represent the same elements.

A preferred embodiment of the package of the invention comprises a rectangular dielectric substrate 1 having conductor metallization fingers 2 printed thereon in a desired pattern. The pattern converges toward a cavity 3 in the center of the substrate 1. The cavity may or may not be provided and is not essential to the package of the invention. A dielectric layer 4 may be provided covering all but the inner and outer extremities of each finger 2. A seal ring 5 may also be provided on dielectric layer 4 for receiving a lid 16 which may be placed over the semiconductor chip 15 for hermetically sealing the package. In the embodiment shown an edge 14 of the dielectric layer 4 is disposed to extend beyond the seal ring 5, but not to cover the extremities 12 of the finger 2. Conductor pads 17 are provided along edges of the substrate 4 according to the preferred embodiment of the invention. The conductive pads may be integrally formed with the metallization fingers 2. The fugitive shorting means or bar 18 is preferably disposed along each edge and at least one end of the substrate in electrical contact with the conductive pads 17.

The shorting means or bar 18 is preferably a silver metallization and may be applied with or without a glass frit by screen printing techniques in accordance with the process of the invention. The shorting means or bar is preferably applied by screen printing a metallizing composition of finely-divided silver powder, e.g., 0.75 to 1.95 $meter^2/gram$ surface area, over the conductive pads or leads and substrate. To prevent possible contamination of the semiconductor chip with organic volatiles from the screen printing vehicle, the package is preferably fired at a mild temperature, e.g., 5 minutes at 300°C. prior to attaching the semiconductor device.

Although as stated above, silver is the preferred composition for the shorting means or bar, other metallizations or noble and base metal resinates, e.g., gold, silver or tin resinates, may be used to form the shorting bar. The essential material requirements of the shorting means are that on drying and/or after firing it have electrical resistance less than about 10,000 ohms, have sufficient durability to withstand conventional die mounting, wire bonding, and gold-tin sealing thermal requirements and that it be completely and easily removed by the circuit manufacturer, after the semiconductor chip is inserted in the package, by the solder leaching action of conventional solders.

In general, where the shorting bar is a screen-printed metallization or resinate, it should be first dried to remove solvent at, e.g., 110°C. for 10 minutes, and then preferably fired at a peak temperature of up to approximately 500°C. to provide a metallic film having an electrical resistance of less than approximately 10,000 ohms.

As stated above, according to the process of the invention, the shorting means or bar is fugitive on being immersed in solder, i.e., it dissolves and is completely removed from between the conductive pads or conductor leads. Although many metals will dissolve if given adequate dwell time in solder, the preferred composition will dissolve in conventional solders, e.g., tin-lead-silver or tin-lead solders, under normal wave or dip solder temperatures and solder time, e.g., 220° to 350°C. and 2 to 15 seconds. Additionally, the preferred compositions will dissolve in the solder much more readily than the lead attach solder pad or conductor pad of the package of the preferred embodiment which is a palladium/silver metallization.

A suitable composition for the shorting means or bar is a metallizing composition of 65/35, by weight, silver/vehicle, wherein the silver is in finely-divided form having a surface area from 0.95 to 1.65 meters$^2$/gram and the vehicle is a mixture of rosin, ethylhydroxy ethyl cellulose, terpineol, and Magie Oil 470 (an aliphatic hydrocarbon sold by Magie Brothers Chemical Company). Additionally, a glass frit, as described in Example I of U.S. Pat. No. 2,822,279, may be included in the composition up to about 5% by weight of the solids, and preferably not more than 2.5% by weight. Other suitable compositions may be prepared containing from 95 to 100% finely-divided gold, tin, lead or mixtures thereof as the metal powder with or without glass frit. Additionally, bismuth oxide may be admixed with the metal powder and glass frit up to about 20% of the solids by weight.

The package and process of the invention are further illustrated by the examples below in which all percentages are by weight unless otherwise stated.

EXAMPLE I

A metallized substrate for a dual inline semiconductor package was prepared by printing a palladium/silver (2.5/1.0) metallization of a prefired 60-mil thick alumina substrate. The metallization provided a conductor pattern having approximately 50 mils square lead attach solder pads along both edges of the substrate. The substrate was then fired at approximetely 890°C. A dielectric layer about 4-mil thick was printed over selected portions of the metallized substrate, but not over the lead attach solder pad along both edges. The dielectric composition was printed as a paste of 73 parts of glass frit/27 parts liquid vehicle. The frit composition being a mixture of barium oxide, aluminum oxide, silicon dioxide, titanium dioxide, zinc oxide and lead oxide. A metallized sealing composition was screen printed on the dielectric layer around the cavity disposed therein for receiving the semiconductor chip. The substrate having the metallized conductors and integral lead attach pads thereon, dielectric layer and metallized sealing composition was then fired at 890°C. A silver metallizing composition was prepared in a Hoover muller comprising 65% finely-divided silver powder (average surface area from 0.96 to 1.65, meters$^2$/gram) and 35% vehicle. The vehicle was a mixture of terpineol, and ethylhydroxy ethyl cellulose. The composition was then printed as a narrow strip or bar along both edges and across one end of the substrate using a 325 mesh screen overlaying the substrate and lead attach solder pads. The metallizing composition was dried at 125°C. for 15 minutes and given a mild fire at 400°C. for 10 minutes to provide a resistance of less than 10,000 ohms.

A semiconductor chip was then die bonded in the cavity by eutectic die bonding to a gold pad at the bottom of the cavity. Electrical connections from the inner conductor finger disposed around the cavity were made to the semiconductor chip by wire bonding. A gold plated Kovar lid and solder preform was placed over the sealing composition and thermally sealed by heating at 345°C. for 2 minutes. Suitable leads were attached to the lead attach solder pads and soldered using 62/36/2 Sn/Pb/Ag solder in a wave solder machine at a temperature of 238°C. On removal from the solder bath the packaged electronic circuits were examined. The shorting bar had been completely removed by the leaching action of the solder, as indicated by an insulation resistance of greater than $10^{13}$ ohms between leads. The lead members had been satisfactorily soldered to the lead attach solder pads, and the solder pads have not been significantly damaged by the leaching action of the solder.

EXAMPLE II

A metallized substrate was prepared as recited in Example I. A silver metallization was prepared comprising 50%, finely divided silver powder having an average surface area in the range 0.75 to 1.65 meters$^2$ per gram, 2.25% glass frit, 9% bismuth oxide, and 38.75% vehicle. The composition was then screen-printed as in Example I to provide a shorting bar. The metallizing composition was dried at 110°C. for 30 minutes and fired at 300°C. for 10 minutes to provide a resistance of less than 10,000 ohms. A semiconductor chip was inserted in the package as in Example I, and leads attached to the solder pads and wave soldered using 62/36/2 Sn/Pb/Ag solder at 227°C. The packaged circuit was examined and the shorting bar had been completely removed as in Example I.

EXAMPLE III

A semiconductor package was prepared and a shorting bar was screen-printed thereon, as described in Example II, using a metallizing composition comprising 40% finely divided silver, 1.8% glass frit, 7.2% bismuth oxide and 51% vehicle. The composition was dried 125°C. for 30 minutes. The dried film had a resistance of less than 10,000 ohms. Leads were attached and soldered as recited in Example II. The package circuit was examined and the shorting bar had been completely removed as in Example II.

EXAMPLE IV

A semiconductor package was prepared and a shorting bar was screen-printed thereon as described in Example I, using a gold resinate (Englehard Hanovia No. 6973), dried at 110°C. for 10 minutes, and fired at 500°C. for 5 minutes to form a metallic gold film having a resistance of less than 10,000 ohms. Leads were attached to the solder pads and wave soldered using 62/36/2 Sn/Pb/Ag solder at 251°C. The packaged circuit was examined and the shorting bar had been completely removed as in Example I.

What is claimed is:

1. In a process for packaging a semiconductor chip in a package comprising a substrate having conductor patterns thereon and conductor pads connected to said conductor pattern, the improvement comprising the steps of applying a fugitive shorting bar or strip to said substrate and overlaying said conductor pads, inserting said semiconductor chip in said package and connecting said chip to said conductor pattern, and removing said shorting bar by solder leaching while soldering leads to said pads.

2. A process according to claim 1, wherein said shorting bar or strip is applied by screen printing.

3. A process according to claim 2, wherein said shorting bar is a silver metallization and said solder is tin-lead-silver or tin-lead.

* * * * *